United States Patent
Dawson et al.

(10) Patent No.: US 9,714,879 B2
(45) Date of Patent: Jul. 25, 2017

(54) ELECTRICALLY CONDUCTIVE BARRIERS FOR INTEGRATED CIRCUITS

(71) Applicant: Freescale Semiconductor, Inc., Austin, TX (US)

(72) Inventors: Chad S. Dawson, Queen Creek, AZ (US); Andrew C. McNeil, Chandler, AZ (US); Jinbang Tang, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 97 days.

(21) Appl. No.: 14/832,924

(22) Filed: Aug. 21, 2015

(65) Prior Publication Data
US 2017/0052082 A1    Feb. 23, 2017

(51) Int. Cl.
| | |
|---|---|
| *G01L 9/00* | (2006.01) |
| *H01L 23/00* | (2006.01) |
| *H01L 23/552* | (2006.01) |
| *G01L 19/06* | (2006.01) |
| *H01L 23/24* | (2006.01) |

(52) U.S. Cl.
CPC .......... *G01L 9/0073* (2013.01); *H01L 23/552* (2013.01); *H01L 24/03* (2013.01); *H01L 24/09* (2013.01); *H01L 24/49* (2013.01); *G01L 19/0627* (2013.01); *H01L 23/24* (2013.01); *H01L 24/45* (2013.01); *H01L 2224/04042* (2013.01); *H01L 2224/0603* (2013.01); *H01L 2224/45124* (2013.01); *H01L 2224/45144* (2013.01); *H01L 2224/45147* (2013.01); *H01L 2224/4813* (2013.01); *H01L 2224/73265* (2013.01); *H01L 2924/10253* (2013.01); *H01L 2924/10329* (2013.01); *H01L 2924/14* (2013.01); *H01L 2924/19107* (2013.01); *H01L 2924/30105* (2013.01)

(58) Field of Classification Search
None
See application file for complete search history.

(56) References Cited

U.S. PATENT DOCUMENTS

| | | |
|---|---|---|
| 8,012,868 B1 | 9/2011 | Naval et al. |
| 2007/0241440 A1 | 10/2007 | Hoang et al. |
| 2010/0224966 A1* | 9/2010 | Chen .................. H01L 23/3121 257/621 |

(Continued)

*Primary Examiner* — Andre Allen

(57) ABSTRACT

Electrically conductive barriers for integrated circuits and integrated circuits and methods including the electrically conductive barriers. The integrated circuits include a semiconductor substrate, a semiconductor device supported by a device portion of the substrate, and a plurality of bond pads supported by a bond pad portion of the substrate. The integrated circuits also include an electrically conductive barrier that projects away from an intermediate portion of the substrate and is configured to decrease capacitive coupling between the device portion and the bond pad portion. The methods can include methods of manufacturing an integrated circuit. These methods include forming a semiconductor device, forming a plurality of bond pads, forming a plurality of electrically conductive regions, and forming an electrically conductive barrier. The methods also can include methods of operating an integrated circuit. These methods include applying an input electric signal, receiving an output electric signal, and applying a reference potential.

21 Claims, 6 Drawing Sheets

(56) References Cited

U.S. PATENT DOCUMENTS

| | | | | |
|---|---|---|---|---|
| 2011/0241793 A1* | 10/2011 | Frye | ............... | H01L 23/5223 333/25 |
| 2012/0217640 A1* | 8/2012 | Choi | ............. | H01L 24/03 257/751 |
| 2013/0269974 A1* | 10/2013 | Daubenspeck | ......... | H01L 24/05 174/110 N |
| 2013/0307094 A1* | 11/2013 | Yoshiuchi | .......... | G01C 19/5783 257/415 |

* cited by examiner

ELECTRICALLY CONDUCTIVE BARRIERS FOR INTEGRATED CIRCUITS

FIELD

This disclosure relates generally to electrically conductive barriers for integrated circuits, and more specifically, to electrically conductive barriers that decrease capacitive coupling between a semiconductor device and bond pads that are in electrical communication with the semiconductor device, as well as to integrated circuits and methods that include or utilize the electrically conductive barriers.

BACKGROUND

Integrated circuits can include a semiconductor device and one or more bond pads that are in electrical communication with the semiconductor device. The bond pads provide electrical communication between the integrated circuit and another device that can control or utilize the integrated circuit. As an example, a respective wire may be wire-bonded to each of the bond pads to provide electrical communication between the integrated circuit and the other device.

In some integrated circuits, the bond pads are proximal to the semiconductor device such that significant, or measurable, capacitive coupling is present between the bond pads and the semiconductor device or between the bond wires and the semiconductor device. When this capacitive coupling is consistent, or predictable, it generally can be accounted for; however, when this capacitive coupling is not consistent, or predictable, it can create challenges associated with operation of the integrated circuit.

As an example, semiconductor devices, in the form of capacitive pressure sensors, can be utilized to detect a pressure. The capacitive pressure sensors rely on a capacitance measurement to detect the pressure, and a full-scale range of this capacitance measurement can be on the order of 100's of femtofarads (fF). Integrated circuits that include capacitive pressure sensors often are coated with a dielectric gel to protect the integrated circuits from environmental damage while, at the same time, permitting the capacitive pressure sensors to detect pressure forces from an ambient environment that surrounds the integrated circuit.

Air bubbles can form within the dielectric gel. When these air bubbles form proximal the capacitive pressure sensor, proximal the bond pads, or proximal the wires, they can change the capacitive coupling between the capacitive pressure sensor and the bond pads or between the capacitive pressure sensor and the wires. This change in capacitive coupling can cause shifts in the capacitance measurement of the capacitive pressure sensor that can be on the order of 10's of fF. Such shifts can make it difficult to reproducibly manufacture or calibrate integrated circuits that include capacitive pressure sensors. Decreasing the magnitude of these shifts in the capacitance measurement can improve reproducibility of manufacture or calibration of the integrated circuits.

BRIEF DESCRIPTION OF THE DRAWINGS

The present invention is illustrated by way of example and is not limited by the accompanying Figures, in which like references indicate similar elements. Elements in the Figures are illustrated for simplicity and clarity and have not necessarily been drawn to scale.

DETAILED DESCRIPTION

As discussed, decreasing the magnitude of shifts in the capacitance measurement can be beneficial. Decreasing the capacitive coupling between the capacitive pressure sensor and the bond pads or between the capacitive pressure sensor and the wires, such as via inclusion of an electrically conductive barrier between the capacitive pressure sensor and the bond pads, can decrease the magnitude of the shifts in the capacitance measurement. As an example, mathematical modelling indicates an approximately tenfold decrease in the magnitude of the shifts in the capacitance measurement for a configuration that includes the electrically conductive barrier when compared to a configuration that does not include the electrically conductive barrier.

Figure 1:
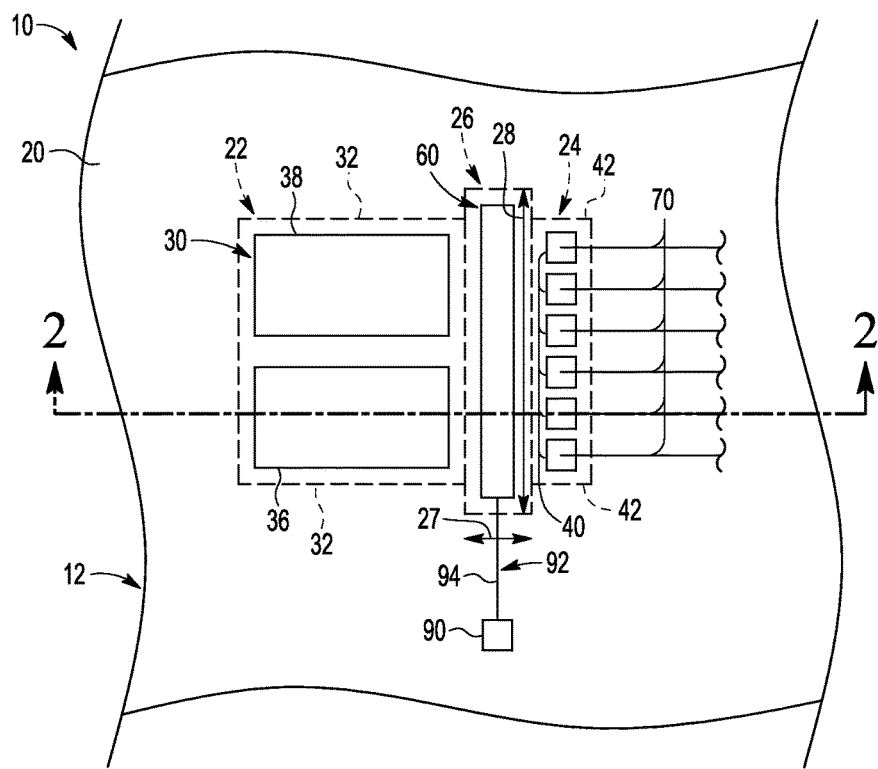
FIG. 1 is a schematic top view of an integrated circuit.
Figure 2:
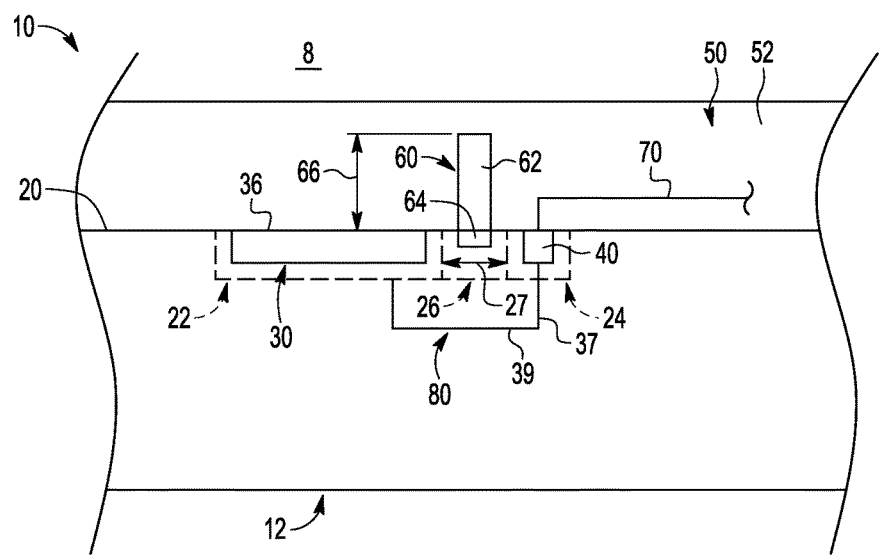
FIG. 2 is a schematic cross-sectional view of the integrated circuit of FIG. 1 taken along line 2-2 of FIG. 1.

FIG. 1 is a schematic top view of an integrated circuit 10, while FIG. 2 is a schematic cross-sectional view of the integrated circuit of FIG. 1 taken along line 2-2 of FIG. 1. As illustrated in FIGS. 1-2, integrated circuit 10 includes a semiconductor substrate 12. Semiconductor substrate 12 also can be referred to herein as a substrate 12 and has, forms, or defines, a surface 20. Integrated circuit 10 also includes a semiconductor device 30, a plurality of bond pads 40, and an electrically conductive barrier 60.

Semiconductor device 30 is supported by a device portion 22 of semiconductor substrate 12, bond pads 40 are supported by a bond pad portion 24 of semiconductor substrate 12, and electrically conductive barrier 60 is supported by an intermediate portion 26 of semiconductor substrate 12. As illustrated, bond pad portion 24 is spaced apart from device portion 22, and intermediate portion 26 separates, or extends between, the bond pad portion and the device portion.

As used herein, the phrase "supported by," when referring to a relationship between semiconductor substrate 12 and one or more components of semiconductor device 30, bond pads 40, or electrically conductive barrier 60, is intended to indicate that the one or more components are "supported by" semiconductor substrate 12 in any suitable manner, including those that are conventional to semiconductor manufacturing technologies. As examples, the one or more components can be attached to the substrate, can be formed on the substrate, can be formed in the substrate, can be formed within the substrate, can be formed over the substrate, can be formed above the substrate, can extend from the substrate, can extend within the substrate, can extend above the substrate, can extend over the substrate, or can be formed within a layer that is supported by the substrate.

The dashed lines in FIGS. 1-2 indicate boundaries for device portion 22, bond pad portion 24, and intermediate portion 26 of semiconductor substrate 12 and illustrate that these portions of substrate 12 can extend from surface 20, can extend within substrate 12, or can be defined within substrate 12. For clarity, FIGS. 1-2 illustrate device portion 22, bond pad portion 24, and intermediate portion 26 as extending past structures that are contained therein; however, this is not required. As an example, device portion 22 or bond pad portion 24 can extend in contact with at least a portion of an outer periphery of structures that are contained therein, such as semiconductor device 30 or bond pads 40, respectively. As another example, intermediate portion 26 can extend in contact with the portion of the outer periphery of the structures that are contained within device portion 22 or bond pad portion 24. Regardless of the exact configuration of device portion 22 and bond pad portion 24, intermediate portion 26 generally will extend entirely between, or will be in contact with, the device portion and the bond pad portion, at least in a plane of surface 20.

As illustrated in FIG. 2, electrically conductive barrier 60 extends from, extends away from, projects from, or projects away from, intermediate portion 26 of substrate 12. Stated another way, electrically conductive barrier 60 has a nonzero height 66 above surface 20 of substrate 12, extends above surface 20, or extends above surface 20 an amount that is greater than an extent of semiconductor device 30 or bond pads 40 above surface 20. In general, larger values for height 66 provide a corresponding decrease in the capacitive coupling between device portion 22 and bond pad portion 24, between semiconductor device 30 and bond pads 40, or between semiconductor device 30 and wires 70 that can be wire bonded to bond pads 40. With this in mind, a value for height 66 can be limited, largely, by spatial, or geometric, constraints regarding a layout of integrated circuit 10 or by cost considerations associated with a cost of forming electrically conductive barrier 60. Examples of height 66 include heights that are at least 1, at least 1.25, at least 1.5, at least 1.75, or at least 2 times a width 27 of intermediate portion 26.

As illustrated in FIG. 1, integrated circuit 10 can include a reference potential generator 90. Reference potential generator 90 is electrically connected to electrically conductive barrier 60, such as via a reference potential electrical connection 92, and is configured to apply a reference potential 94 to the electrically conductive barrier. Stated another way, reference potential generator 90 is configured to maintain electrically conductive barrier 60 at, or near, the reference potential. Such a configuration can permit electrically conductive barrier 60 to decrease, limit, or restrict capacitive coupling between semiconductor device 30 and bond pads 40 or wires 70 that are bonded to bond pads 40.

As an example, at least a portion of an electric field that is generated by electric current flow within semiconductor device 30 can be absorbed by electrically conductive barrier 60 or can be blocked, by the electrically conductive barrier, from reaching bond pads 40 or wires 70. As another example, at least a portion of an electric field that is generated by electric current flow within bond pads 40 or wires 70 can be absorbed by electrically conductive barrier 60 or can be blocked, by the electrically conductive barrier, from reaching semiconductor device 30. This decrease in electric field communication between semiconductor device 30 and bond pads 40 or wires 70 decreases capacitive coupling therebetween.

Electrically conductive barrier 60 can include any suitable structure that decreases capacitive coupling between semiconductor device 30 and bond pads 40 or wires 70. As an example, and as illustrated in FIG. 2, electrically conductive barrier 60 can include an electrically conductive barrier strip 64 that is supported by intermediate portion 26.

Electrically conductive barrier strip 64 can be constructed, or formed, in any suitable manner or utilizing any suitable process, including those that are conventional to semiconductor manufacturing technologies. As examples, electrically conductive barrier strip 64 can be constructed utilizing one or more of an etch process, a lithography process, a deposition process, an implant process, and a dual damascene process.

Similarly, electrically conductive barrier strip 64 can be formed from or include any suitable material or materials of construction. As examples, electrically conductive barrier strip 64 can include an electrically conductive material, a metal, aluminum, copper, gold, polysilicon, a silicide, or a doped semiconductor material.

Electrically conductive barrier 60 also can include any suitable structure that projects away from intermediate portion 26 or that thereby decreases capacitive coupling between semiconductor device 30 and bond pads 40 or wires 70. As an example, and as perhaps illustrated most clearly in FIG. 3, electrically conductive barrier 60 additionally or alternatively can include at least one electrically conductive barrier wire 62. Electrically conductive barrier wire 62 projects away from intermediate portion 26, projects away from electrically conductive barrier strip 64, when present, or defines height 66. Electrically conductive barrier 60 can include any suitable number of electrically conductive barrier wires 62, such as at least 1, at least 2, at least 3, or at least 4 electrically conductive barrier wires 62. A more specific example of electrically conductive barriers 60 that include 2 electrically conductive barrier wires 62 is illustrated in FIG. 3 and discussed in more detail herein.

In general, an increase in the number of electrically conductive barrier wires 62 will produce a corresponding decrease in capacitive coupling between semiconductor device 30 and bond pads 40 or wires 70. With this in mind, a number, or maximum number, of electrically conductive barrier wires 62 utilized within a given electrically conductive barrier 60 can be limited, largely, by spatial, or geometric, constraints regarding a layout of integrated circuit 10 or by cost considerations associated with a cost of forming electrically conductive barrier wires 62.

Electrically conductive barrier wires 62 can be constructed, or formed, in any suitable manner or utilizing any suitable process, including those that are conventional to semiconductor manufacturing technologies. As an example, electrically conductive barrier wires 62 can be constructed utilizing a wire bonding process. Under these conditions, one end, or both ends, of a given electrically conductive barrier wire 62 will be operatively attached to intermediate portion 26 or to electrically conductive barrier strip 64. In addition, a central portion of the given electrically conductive barrier wire can be spaced apart from intermediate portion 26 or from electrically conductive barrier strip 64. This is illustrated in FIG. 3 and discussed in more detail herein.

Figure 3:
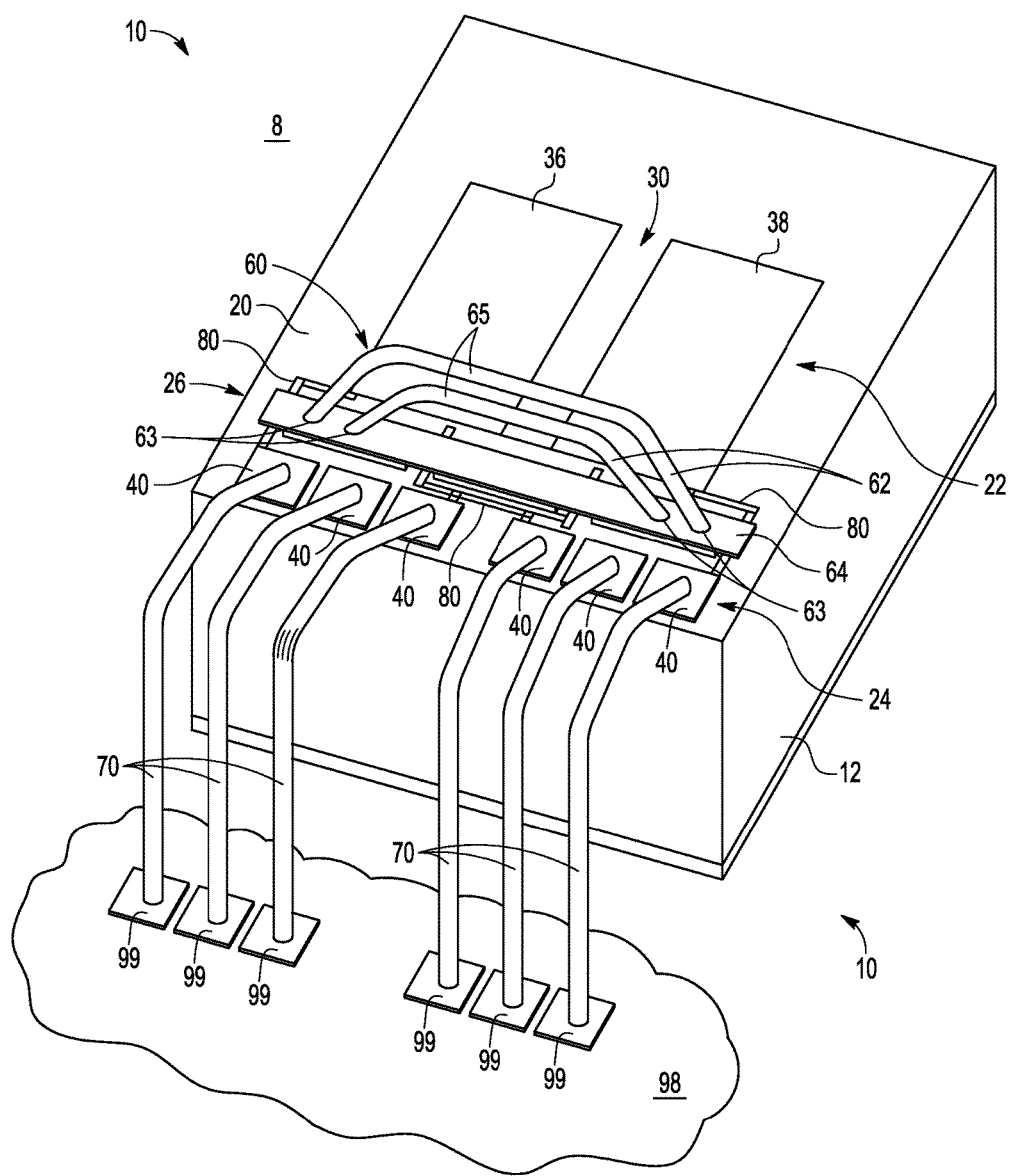
FIG. 3 is a less schematic profile view of an integrated circuit.

In the example of FIG. 3, a wire bonding machine can be utilized to attach ends 63 of a given electrically conductive barrier wire 62 to electrically conductive barrier strip 64. For example, a first end 63 of the given electrically conductive barrier wire 62 can be attached to electrically conductive barrier strip 64. Subsequently, the wire bonding machine and the electrically conductive barrier strip can be translated relative to one another such that a second end 63 of the given electrically conductive barrier wire can be attached to the electrically conductive barrier strip. During the relative translation of the wire bonding machine and the electrically conductive barrier strip, a central portion 65 of the electrically conductive barrier wire can be placed and/or located, via the wire bonding machine, such that the central portion of the electrically conductive barrier wire projects away from intermediate portion 26 of substrate 12, as discussed herein.

Similarly, electrically conductive barrier wires 62 can be formed from or include any suitable material or materials of construction. As examples, electrically conductive barrier wires 62 can include an electrically conductive material, a metal, aluminum, copper, or gold.

Semiconductor device 30 can include any suitable device, or solid state device, that can be supported by substrate 12. As an example, semiconductor device 30 can include, or be, a capacitive sensor, which can be configured to make, or perform, a capacitive measurement. As another example, semiconductor device 30 can include, or be, a capacitive pressure sensor, which can be configured to detect, or capacitively detect, a pressure. This can include detection of a pressure within an ambient environment 8 that surrounds, or is proximal to, the capacitive pressure sensor, as illustrated in FIG. 2. Examples of capacitive sensors or capacitive pressure sensors include a pair of conductors separated by a dielectric material. Examples of the conductors include metallic conductors and doped semiconductor conductors. Examples of the dielectric material include polymeric materials, oxides, and silicon oxides.

When semiconductor device 30 includes the capacitive pressure sensor, the capacitive pressure sensor can include a reference region 36 and a sense region 38. The reference region can be configured to generate a reference signal 37 and the sense region can be configured to generate a sense signal 39, as illustrated in FIG. 2. The reference signal can act as a calibration standard, or reference point, and the sense signal can be indicative of the pressure that is detected by the capacitive pressure sensor.

As illustrated in FIG. 2, integrated circuit 10 also can include a dielectric coating 50. Dielectric coating 50 can at least partially coat, cover, or encapsulate device portion 22, at least a portion of device portion 22, semiconductor device 30, at least a portion of semiconductor device 30, bond pad portion 24, at least a portion of bond pad portion 24, bond pads 40, at least a portion of bond pads 40, intermediate portion 26, at least a portion of intermediate portion 26, electrically conductive barrier 60, or at least a portion of electrically conductive barrier 60.

Dielectric coating 50 can be constructed, or formed, in any suitable manner or utilizing any suitable process, including those that are conventional to semiconductor manufacturing technologies. As examples, dielectric coating 50 can be constructed via a deposition process, a dip-coating process, a spin-coating process, a spraying process, a brushing process, or a flowing process.

Dielectric coating 50 can include any suitable material or materials. As examples, dielectric coating 50 can include a polymeric material, an epoxy, or a dielectric gel 52. When dielectric coating 50 includes the dielectric gel, the dielectric gel can be adapted, configured, or selected to permit the pressure within ambient environment 8 to apply a pressure force to semiconductor device 30. This can include transfer of the pressure force to the semiconductor device via the dielectric gel. When semiconductor device 30 includes the capacitive pressure sensor, dielectric gel 52 can permit the pressure force to be applied to the capacitive pressure sensor, thereby permitting the capacitive pressure sensor to measure the pressure.

As illustrated in FIGS. 1-2, intermediate portion 26 extends between device portion 22 and bond pad portion 24, extends directly between device portion 22 and bond pad portion 24, separates device portion 22 from bond pad portion 24, or completely separates device portion 22 from bond pad portion 24. Stated another way, device portion 22 and bond pad portion 24 do not contact one another, at least in the vicinity of, or on, surface 20, and instead contact intermediate portion 26. Stated yet another way, a region of device portion 22 that faces toward bond pad portion 24 is separated from bond pad portion 24 by intermediate portion 26, at least in a vicinity of, or on, surface 20. Stated another way, a region of device portion 22 that is directly opposed to a corresponding region of bond pad portion 24 is separated from the corresponding region of bond pad portion 24 by intermediate portion 26, at least in the vicinity of, or on, surface 20.

Intermediate portion 26 can have, or define, width 27 and a length 28, both of which can be measured along, or within a plane of, surface 20. Width 27 can be measured between device portion 22 and bond pad portion 24. As an example, width 27, or an average width 27, can be defined as an average distance between device portion 22 and bond pad portion 24 as measured along surface 20. Length 28 can be measured perpendicular to width 27 or can be measured along a longitudinal axis of intermediate portion 26. In general, length 28 is greater than width 27.

Electrically conductive barrier 60 can extend along at least a threshold fraction of length 28. Examples of the threshold fraction include at least 70%, at least 80%, at least 90%, at least 95%, or 100%. In general, a larger value for length 28, or a larger value for the threshold fraction of length 28, provides a correspondingly greater decrease in the capacitive coupling between semiconductor device 30 and bond pads 40 or wires 70 during operation of integrated circuit 10. However, larger values for length 28, or for the threshold fraction of length 28, cause intermediate portion 26 to occupy a correspondingly larger fraction of surface 20. Therefore, the exact value of length 28 can be selected based upon a desired decrease in the capacitive coupling and on availability of surface area on surface 20. As illustrated in FIG. 1, electrically conductive barrier 60 generally will extend at least to, and often past, sides 32 of device portion 22 or past sides 42 of bond pad portion 24.

A minimum value of width 27 also can be referred to herein as a minimum distance between device portion 22 and bond pad portion 24. A larger value for width 27 provides a correspondingly greater decrease in the capacitive coupling between semiconductor device 30 and bond pad pads 40 or wires 70. However, larger values for width 27 cause intermediate portion 26 to occupy a correspondingly larger fraction of surface 20. Therefore, the exact value of width 27 can be selected based upon a desired decrease in the capacitive coupling and on availability of surface area on surface 20. In general, and because of spatial constraints on surface 20, width 27 may need to be selected such that there is a potential for significant, or measurable, capacitive coupling between semiconductor device 30 and bond pads 40 or wires 70, at least in integrated circuits that are similar to integrated circuit 10 but that do not include electrically conductive barrier 60. Examples of the minimum distance between device portion 22 and bond pad portion 24 included minimum distances of less than 2 millimeters (mm), less than 1 mm, less than 0.5 mm, less than 0.4 mm, less than 0.3 mm, less than 0.2 mm, less than 0.1 mm, or less than 0.05 mm.

Bond pads 40 are in electrical communication with semiconductor device 30, such as to permit at least one electric current to be conveyed between the bond pads and the semiconductor device. As an example, a plurality of electrically conductive regions 80 can be supported by, or extend within, semiconductor substrate 12 and can convey the at least one electric current. One such electrically conductive region 80 is illustrated FIG. 2. As illustrated, the electrically conductive regions can be spaced apart, or electrically isolated, from electrically conductive barrier 60.

Examples of the at least one electric current include an input electric signal, which is provided from bond pads 40 to semiconductor device 30, or an output electric signal, which is provided from semiconductor device 30 to bond pads 40. Additional examples of the at least one electric current include reference signal 37 or sense signal 39.

As discussed, wires 70 can be bonded to bond pads 40. As an example, wires 70 can permit or facilitate electrical communication between integrated circuit 10 and another device that can utilize or control integrated circuit 10. As illustrated in FIG. 1, each wire 70 in a plurality of wires 70 can be electrically connected to a selected one of the plurality of bond pads 40.

Wires 70 can be constructed, or formed, in any suitable manner or utilizing any suitable process, including those that are conventional to semiconductor manufacturing technologies. As an example, wire 70 can be constructed utilizing a wire bonding process. Similarly, wires 70 can be formed from or include any suitable material or materials of construction. As examples, wires 70 can include an electrically conductive material, a metal, aluminum, copper, or gold.

As discussed, integrated circuit 10 can include reference potential generator 90. Reference potential generator 90 can include any suitable structure that can be electrically connected to electrically conductive barrier 60, such as via reference potential connection 92, or that can be configured to apply reference potential 94 to the electrically conductive barrier. As an example, reference potential generator 90 can include, or be, a voltage source. As another example, reference potential generator 90 can include, or be, a bond pad, such as one of bond pads 40, that is configured to receive reference potential 94 from another voltage source. The other voltage source can be separate from and in electrical communication with integrated circuit 10.

Semiconductor substrate 12 can include any suitable substrate that is formed from a semiconducting material. As an example, semiconductor substrate 12 can include, or be, a semiconductor wafer or a die that has been singulated, or cut, from the semiconductor wafer. Examples of the semiconducting material include silicon, gallium arsenide, or Group III-V semiconducting materials.

FIG. 3 is a less schematic profile view of an integrated circuit 10. Integrated circuit 10 of FIG. 3 is substantially similar to integrated circuit 10 of FIGS. 1-2, and any of the structures, functions, or features that are discussed herein with respect to integrated circuit 10 of FIGS. 1-2 can be included in or utilized with integrated circuit 10 of FIG. 3. Similarly, any of the structures, functions, or features that are discussed herein with respect to integrated circuit 10 of FIG. 3 can be include in or utilized with integrated circuit 10 of FIGS. 1-2.

As illustrated in FIG. 3, integrated circuit 10 includes a semiconductor device 30, a plurality of bond pads 40, and an electrically conductive barrier 60. Wires 70 extend from bond pads 40 to corresponding bond pads 99 of another device 98. The other device can control or utilize integrated circuit 10. This can include providing one or more input electric currents to integrated circuit 10 or receiving one or more output electric currents from integrated circuit 10 via wires 70, as discussed.

In FIG. 3, electrically conductive barrier 60 includes an electrically conductive barrier strip 64 and two electrically conductive barrier wires 62. The electrically conductive barrier wires can be attached to the electrically conductive barrier strip via a wire bonding process and each end 63 of each electrically conductive barrier wire 62 is bonded to electrically conductive barrier strip 64. In addition, central portion 65 of each electrically conductive barrier wire is detached from electrically conductive barrier strip 64 and projects away from the electrically conductive barrier strip.

Figure 4:
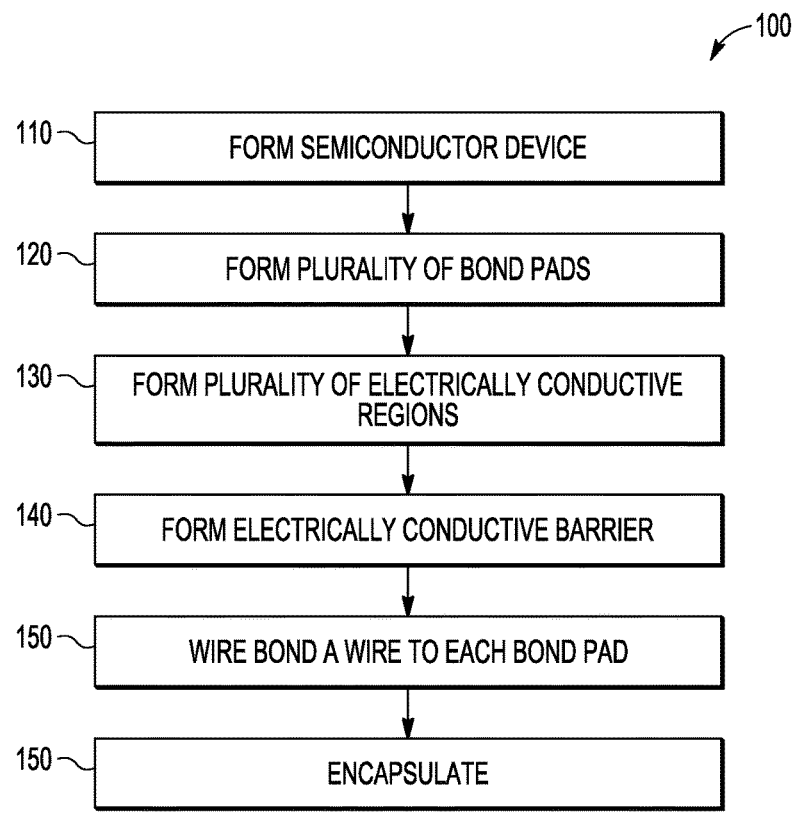
FIG. 4 is a flowchart depicting methods of manufacturing an integrated circuit.

FIG. 4 is a flowchart depicting methods 100 of manufacturing an integrated circuit, such as integrated circuit 10 of FIGS. 1-3. FIGS. 5-11 are steps in a process flow for manufacturing the integrated circuit and can be illustrations of methods 100 of FIG. 4.

Methods 100 include forming a semiconductor device at 110, forming a plurality of bond pads at 120, forming a plurality of electrically conductive regions at 130, and forming an electrically conductive barrier at 140. Methods 100 further can include wire bonding a wire to each bond pad at 150 or at least partially encapsulating at least a portion of the integrated circuit at 160.

Figure 5:
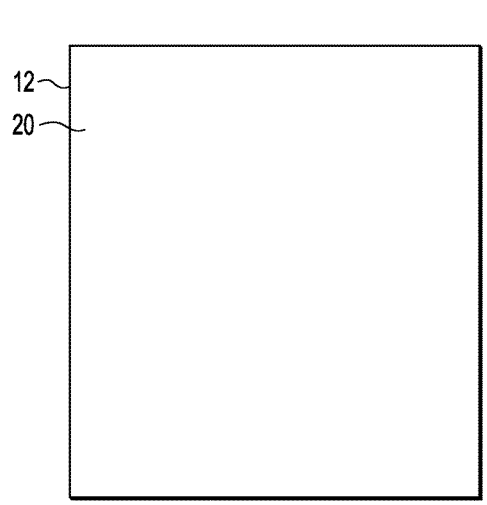
FIG. 5 is a step in a process flow for manufacturing an integrated circuit.
Figure 6:
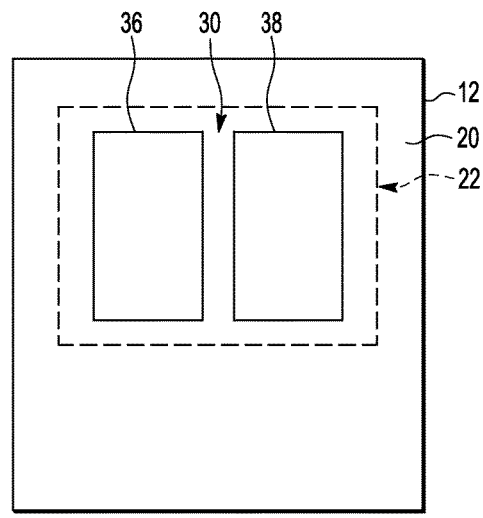
FIG. 6 is another step in the process flow for manufacturing the integrated circuit.

Forming the semiconductor device at 110 can include forming the semiconductor device such that the semiconductor device is supported by a device portion of a semiconductor substrate. This is illustrated in FIGS. 5-6. In FIG. 5, semiconductor substrate 12 does not include a semiconductor device 30. Subsequently, and as illustrated in FIG. 6, semiconductor device 30 has been formed within a device portion 22 of substrate 12. An example of the semiconductor device is a capacitive pressure sensor. Additional examples of the semiconductor device, of the device portion, and of the semiconductor substrate are disclosed herein.

The forming at 110 can be performed at any suitable time or with any suitable sequence during methods 100. As examples, the forming at 110 can be performed at least partially prior to the forming at 120, at least partially concurrently with the forming at 120, at least partially subsequent to the forming at 120, at least partially prior to the forming at 130, at least partially concurrently with the forming at 130, at least partially subsequent to the forming at 130, at least partially prior to the forming at 140, at least partially concurrently with the forming at 140, at least partially subsequent to the forming at 140, prior to the wire bonding at 150, or prior to the encapsulating at 160.

In addition, the forming at 110 can be performed in any suitable manner or utilizing any suitable process, including those that are conventional to semiconductor manufacturing technologies. As examples, the forming at 110 can include performing one or more of an etch process, a lithography process, a deposition process, an implant process, and a dual damascene process.

Figure 7:
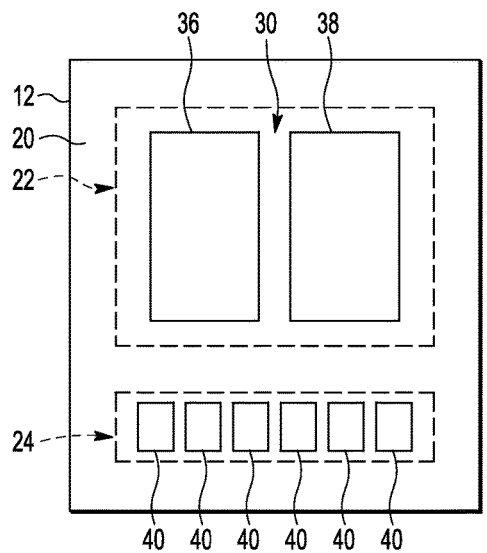
FIG. 7 is another step in the process flow for manufacturing the integrated circuit.

Forming the plurality of bond pads at 120 can include forming the plurality of bond pads such that the plurality of bond pads is supported by a bond pad portion of the substrate. This is illustrated in FIG. 7. Therein, a plurality of bond pads 40 has been formed within a bond pad portion 24 of substrate 12. Examples of the plurality of bond pads and of the bond pad portion are disclosed herein.

The forming at 120 can be performed at any suitable time or with any suitable sequence during methods 100. As examples, the forming at 120 can be performed at least partially prior to the forming at 110, at least partially concurrently with the forming at 110, at least partially subsequent to the forming at 110, at least partially prior to the forming at 130, at least partially concurrently with the forming at 130, at least partially subsequent to the forming at 130, at least partially prior to the forming at 140, at least partially concurrently with the forming at 140, at least partially subsequent to the forming at 140, prior to the wire bonding at 150, or prior to the encapsulating at 160.

In addition, the forming at 120 can be performed in any suitable manner or utilizing any suitable process, including those that are conventional to semiconductor manufacturing technologies. As examples, the forming at 120 can include performing one or more of an etch process, a lithography process, a deposition process, an implant process, and a dual damascene process.

Forming the plurality of electrically conductive regions at 130 can include forming the plurality of electrically conductive regions such that the plurality of electrically conductive regions is supported by the semiconductor substrate. Additionally or alternatively, the forming at 130 also can include forming such that the plurality of electrically conductive regions is configured to convey at least one electric current between the semiconductor device and the plurality of bond pads. The plurality of electrically conductive regions is illustrated in FIGS. 2-3 at 80, and examples of the plurality of electrically conductive regions are discussed herein with reference thereto.

The forming at 130 can be performed at any suitable time or with any suitable sequence during methods 100. As examples, the forming at 130 can be performed at least partially prior to the forming at 110, at least partially concurrently with the forming at 110, at least partially subsequent to the forming at 110, at least partially prior to the forming at 120, at least partially concurrently with the forming at 120, at least partially subsequent to the forming at 120, at least partially prior to the forming at 140, at least partially concurrently with the forming at 140, at least partially subsequent to the forming at 140, prior to the wire bonding at 150, or prior to the encapsulating at 160.

In addition, the forming at 130 can be performed in any suitable manner or utilizing any suitable process, including those that are conventional to semiconductor manufacturing technologies. As examples, the forming at 130 can include performing one or more of an etch process, a lithography process, a deposition process, an implant process, and a dual damascene process.

Figure 8:
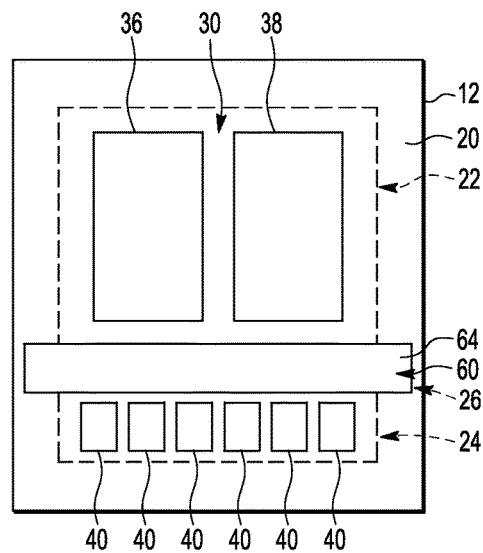
FIG. 8 is another step in the process flow for manufacturing the integrated circuit.

As discussed herein, the bond pad portion can be spaced apart from the device portion such that an intermediate portion of the semiconductor substrate extends between, or separates, the bond pad portion from the device portion. Forming the electrically conductive barrier at 140 can include forming the electrically conductive barrier such that the electrically conductive barrier is supported by the intermediate portion of the substrate. This is illustrated in FIG. 8. Therein, an electrically conductive barrier 60, or at least a portion thereof, is supported by an intermediate portion 26 of substrate 12. In addition, intermediate portion 26 separates device portion 22 from bond pad portion 24.

Additionally or alternatively, the forming at 140 also can include forming such that the electrically conductive barrier projects from the intermediate portion of the substrate. This is illustrated in FIGS. 2-3. Therein, electrically conductive barrier 60 projects from intermediate portion 26 of substrate 12. Examples of intermediate portion 26 and of electrically conductive barrier 60 are disclosed herein.

Figure 9:
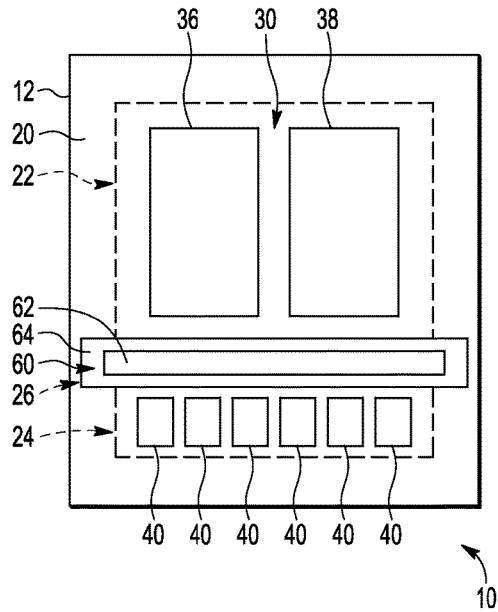
FIG. 9 is another step in the process flow for manufacturing the integrated circuit.

As an example, the forming at 140 can include forming an electrically conductive barrier strip, which is supported by the intermediate portion, and subsequently wire bonding an electrically conductive barrier wire to the electrically conductive barrier strip such that the electrically conductive barrier wire projects away from the intermediate portion or from the electrically conductive barrier strip. FIG. 8 illustrates formation of electrically conductive barrier strip 64, while FIG. 9 illustrates formation of electrically conductive barrier wire 62. As discussed, the forming at 140 can include wire bonding any suitable number of electrically conductive barrier wires to the electrically conductive barrier strip.

The forming at 140 can be performed at any suitable time or with any suitable sequence during methods 100. As examples, the forming at 140 can be performed at least partially prior to the forming at 110, at least partially concurrently with the forming at 110, at least partially subsequent to the forming at 110, at least partially prior to the forming at 120, at least partially concurrently with the forming at 120, at least partially subsequent to the forming at 120, at least partially prior to the forming at 130, at least partially concurrently with the forming at 130, at least partially subsequent to the forming at 130, prior to the wire bonding at 150, or prior to the encapsulating at 160. In general, the electrically conductive barrier wire will be wire bonded to the electrically conductive barrier strip subsequent to the forming at 110 and subsequent to the forming at 120.

The forming at 140 can be performed in any suitable manner or utilizing any suitable process, including those that are conventional to semiconductor manufacturing technologies. As examples, the forming at 140 can include performing a wire bonding process.

Figure 10:
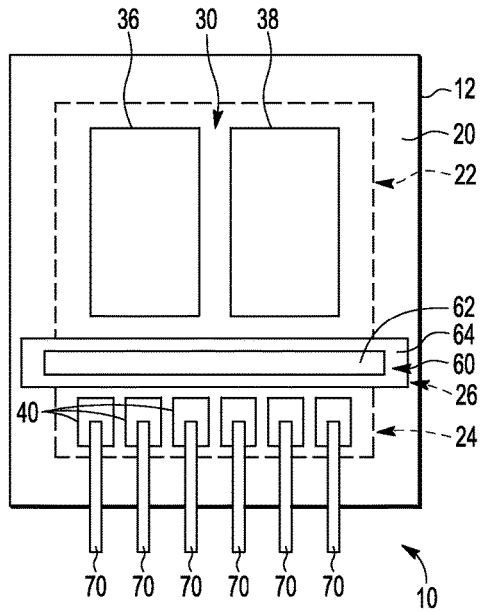
FIG. 10 is another step in the process flow for manufacturing the integrated circuit.

Wire bonding the wire to each bond pad at 150 can include wire bonding a respective wire to each of the plurality of bond pads. This is illustrated in FIG. 10, wherein each bond pad 40 has a respective wire 70 bonded thereto. Examples of the wire are disclosed herein.

The wire bonding at 150 can be performed at any suitable time or with any suitable sequence during methods 100. As examples, the wire bonding at 150 can be performed subsequent to the forming at 110, subsequent to the forming at 120, subsequent to the forming at 130, at least partially prior to the forming at 140, at least partially concurrently with the forming at 140, at least partially subsequent to the forming at 140, or prior to the encapsulating at 160.

In addition, the wire bonding at 150 can be performed in any suitable manner or utilizing any suitable process, including those that are conventional to semiconductor manufacturing technologies. As examples, the wire bonding at 150 can include performing a wire bonding process.

Figure 11:
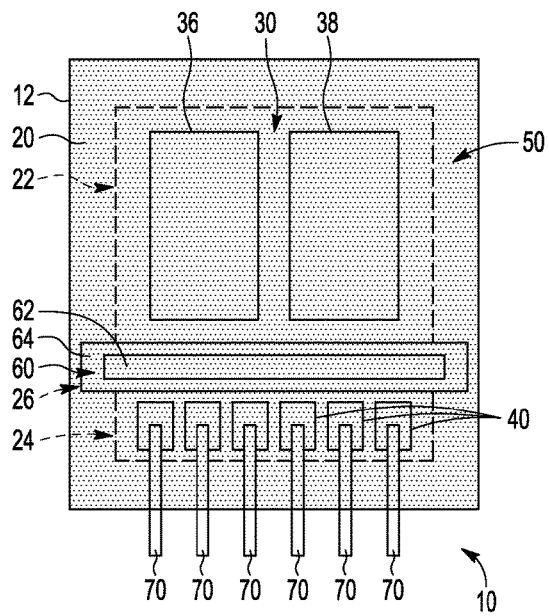
FIG. 11 is another step in the process flow for manufacturing the integrated circuit.

At least partially encapsulating at least the portion of the integrated circuit at 160 can include at least partially encapsulating any suitable portion of the integrated circuit with a dielectric coating. As examples, the encapsulating at 160 can include encapsulating at least a portion, or even all, of the device portion, at least a portion, or even all, of the bond pad portion, at least a portion, or even all, of the intermediate portion, at least a portion, or even all, of the electrically conductive barrier, or at least a portion, or even all, of the wires. As discussed herein, the dielectric coating can include a dielectric gel that is configured to permit a pressure within an ambient environment that is proximal to the integrated circuit to apply a pressure force to the semiconductor device. Additional examples of the dielectric coating are disclosed herein. The encapsulating at 160 is illustrated in FIG. 11. Therein, a dielectric coating 50 covers, coats, or encapsulates an integrated circuit 10.

The encapsulating at 160 can be performed at any suitable time or with any suitable sequence during methods 100. As examples, the encapsulating at 160 can be performed subsequent to the forming at 110, subsequent to the forming at 120, subsequent to the forming at 130, subsequent to the forming at 140, or subsequent to the wire bonding at 150.

In addition, the encapsulating at 160 can be performed in any suitable manner or utilizing any suitable process, including those that are conventional to semiconductor manufacturing technologies. As examples, the encapsulating at 160 can include performing a deposition process, a dip-coating process, a spin-coating process, a spraying process, a brushing process, or a flowing process.

Figure 12:
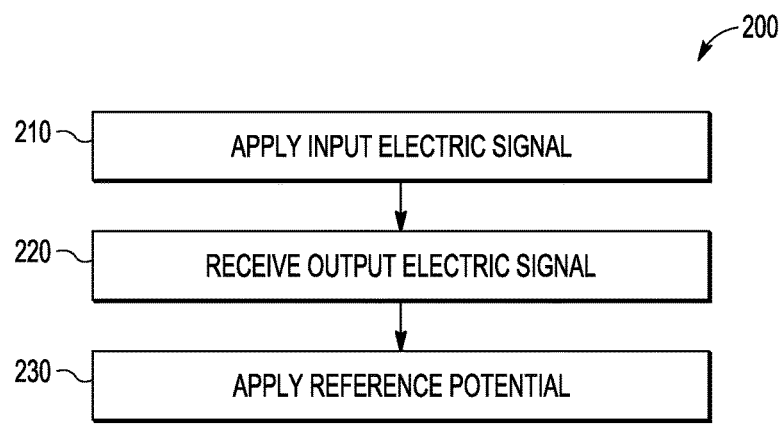
FIG. 12 is a flowchart depicting methods of operating an integrated circuit.

FIG. 12 is a flowchart depicting methods 200 of operating an integrated circuit, such as integrated circuit 10 of FIGS. 1-3. Methods 200 include applying an input electric signal at 210, receiving an output electric signal at 220, and applying a reference potential at 230.

Applying the input electric signal at 210 includes applying the input electric signal to a first bond pad of the integrated circuit. The first bond pad is connected to a capacitive pressure sensor of the integrated circuit. The capacitive pressure sensor is supported by a device portion of a semiconductor substrate of the integrated circuit, and the first bond pad is supported by a bond pad portion of the substrate. The device portion is spaced apart from the bond pad portion such that an intermediate portion of the substrate separates the device portion from the bond pad portion. Examples of the integrated circuit, the first bond pad, the capacitive pressure sensor, the device portion, the bond pad portion, and the intermediate portion are disclosed herein.

As discussed herein, a wire can be wire bonded to the first bond pad. Under these conditions, the applying at 210 can include applying via, or utilizing, the wire. The wire also can be referred to herein as a first wire.

Receiving the output electric signal at 220 includes receiving the output electric signal from a second bond pad of the integrated circuit. The second bond pad is electrically connected to the capacitive pressure sensor and is supported by the bond pad portion of the substrate. The capacitive pressure sensor can produce, or generate, the output electric signal responsive to receipt of the input electric signal. The output electric signal can be indicative of a pressure force that is being applied to the capacitive pressure sensor or of a pressure in an ambient environment that surrounds, is in contact with, or is proximal to, the capacitive pressure sensor.

As discussed herein, a wire can be wire bonded to the second bond pad. Under these conditions, the receiving at 220 can include receiving via, or utilizing, the wire. The wire also can be referred to herein as a second wire.

Applying the reference potential at 230 includes applying the reference potential to an electrically conductive barrier that is supported by the intermediate portion of the substrate. At least a portion of the electrically conductive barrier projects from the intermediate portion of the substrate, and the applying at 230 includes applying the reference potential to the portion of the electrically conductive barrier that projects from the intermediate portion of the substrate. Examples of the electrically conductive barrier are disclosed herein.

As discussed in more detail herein, the electrically conductive barrier can be configured to decrease capacitive coupling between the device portion of the substrate and the bond pad portion of the substrate, between the capacitive pressure sensor and the first and second bond pads, or between the capacitive pressure sensor and the first and second wires, when present. As such, the applying at 230 can include maintaining the electrically conductive barrier at, or near, the reference potential during operation of the capacitive pressure sensor, such as during, or concurrently with, the applying at 210 or the receiving at 220. In such a configuration, the electrically conductive barrier absorbs electric fields that are generated by, or that emanate from, one of the device portion of the substrate and the bond pad portion of the substrate, thereby decreasing receipt of the electric fields by the other of the device portion of the substrate and the bond pad portion of the substrate. Stated another way, the electrically conductive barrier isolates, or at least partially isolates, one of the device portion of the substrate and the bond pad portion of the substrate from electric fields that are generated by the other of the device portion of the substrate and the bond pad portion of the substrate.

Although the invention is described herein with reference to specific embodiments, various modifications and changes can be made without departing from the scope of the present invention as set forth in the claims below. For example, a relative scale of the device portion of the substrate, the bond pad portion of the substrate, and the intermediate portion of the substrate can vary as long as the relative locations thereof are maintained. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first" and "second" are used to arbitrarily distinguish between the elements such terms describe. Thus, these terms are not necessarily intended to indicate temporal or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function may additionally or alternatively be described as being configured to perform that function, and vice versa.

As used herein, the term "or" should be interpreted as being inclusive or exclusive. For example, "A or B" can be interpreted to mean A, B, or both A and B.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/ or methods, are also within the scope of embodiments of the present invention.

The following are various embodiments of the present invention.

In a first embodiment, there is provided an integrated circuit. The integrated circuit includes a semiconductor substrate and a semiconductor device. The semiconductor device is supported by a device portion of the substrate. The integrated circuit includes a plurality of bond pads. The plurality of bond pads is supported by a bond pad portion of the substrate. The plurality of bond pads is in electrical communication with the semiconductor device. The bond pad portion is spaced apart from the device portion such that an intermediate portion of the substrate separates the device portion from the bond pad portion. The integrated circuit includes an electrically conductive barrier. The electrically conductive barrier is supported by the intermediate portion of the substrate. The electrically conductive barrier projects away from the intermediate portion of the substrate. The electrically conductive barrier is configured to decrease capacitive coupling between the device portion and the bond pad portion. The semiconductor device can include a capacitive sensor. The semiconductor device can include a capacitive pressure sensor configured to detect a pressure. The capacitive pressure sensor can include a reference region. The reference region can be configured to generate a reference signal. The capacitive pressure sensor can include a sense region. The sense region can be configured to generate a sense signal that is indicative of the pressure. The integrated circuit can include a dielectric coating that at least partially encapsulates at least the device portion, the bond pad portion, the intermediate portion, and the electrically conductive barrier. The dielectric coating can include a dielectric gel. The dielectric gel can be configured to permit a pressure within an ambient environment that is proximal to the integrated circuit to apply a pressure force to the semiconductor device. The electrically conductive barrier can include an electrically conductive barrier strip that is supported by the intermediate portion of the substrate. The electrically conductive barrier can include an electrically conductive barrier wire that projects away from the electrically conductive barrier strip. The integrated circuit can include a plurality of wires. Each of the plurality of wires can be electrically connected to a selected one of the plurality of bond pads. The electrically conductive barrier can be configured to decrease a capacitive coupling between the semiconductor device and the plurality of wires. The integrated circuit can include a plurality of electrically conductive regions that is supported by the semiconductor substrate. The plurality of electrically conductive regions can be configured to convey at least one electric current between the semiconductor device and the plurality of bond pads. At least one of the plurality of electrically conductive regions can be electrically isolated from the electrically conductive barrier. The semiconductor substrate can have a surface. The intermediate portion of the substrate can have a length, which is measured along the surface. The intermediate portion of the substrate can have a width, which is measured along the surface. The length can be greater than the width. The electrically conductive barrier can extend along an entirety of the length of the intermediate portion of the substrate. The integrated circuit can include a reference potential generator that is electrically connected to the electrically conductive barrier. The reference potential generator can be configured to maintain the electrically conductive barrier at a reference potential. A minimum distance between the device portion of the substrate and the bond pad portion of the substrate, as measured across the intermediate portion of the substrate, can be less than 1 millimeter.

In a second embodiment, there is provided a method of manufacturing an integrated circuit. The method includes forming a semiconductor device such that the semiconductor device is supported by a device portion of a semiconductor substrate. The method includes forming a plurality of bond pads such that the plurality of bond pads is supported by a bond pad portion of the substrate. The bond pad portion of the substrate is spaced apart from the device portion of the substrate such that an intermediate portion of the substrate separates the device portion from the bond pad portion. The method includes forming a plurality of electrically conductive regions such that the plurality of electrically conductive regions is supported by the semiconductor substrate. The plurality of electrically conductive regions is configured to convey at least one electric current between the semiconductor device and the plurality of bond pads. The method includes forming an electrically conductive barrier on the semiconductor substrate such that the electrically conductive barrier is supported by the intermediate portion of the substrate and projects from the intermediate portion of the substrate. The electrically conductive barrier can be configured to decrease capacitive coupling between the device portion of the substrate and the bond pad portion of the substrate. The forming the electrically conductive barrier can include forming an electrically conductive barrier strip, which is supported by the intermediate portion of the substrate. The forming the electrically conductive barrier can include wire bonding an electrically conductive barrier wire to the electrically conductive barrier strip such that the electrically conductive barrier wire projects away from the electrically conductive barrier strip. The method can include at least partially encapsulating at least the device portion, the bond pad portion, the intermediate portion, and the electrically conductive barrier with a dielectric gel. The dielectric gel can be configured to permit a pressure within an ambient environment that is proximal to the integrated circuit to apply a pressure force to the semiconductor device. The forming the semiconductor device can include forming a capacitive pressure sensor. The method can include wire bonding a respective wire to each of the plurality of bond pads.

In a third embodiment, there is provided a method of operating an integrated circuit. The method includes applying an input electric signal to a first bond pad of the integrated circuit. The first bond pad is electrically connected to a capacitive pressure sensor of the integrated circuit. The capacitive pressure sensor is supported by a device portion of a semiconductor substrate of the integrated circuit. The first bond pad is supported by a bond pad portion of the substrate. The device portion is spaced apart from the bond pad portion such that an intermediate portion of the substrate separates the device portion from the bond pad portion. The method includes receiving an output electric signal from a second bond pad of the integrated circuit. The second bond pad is electrically connected to the capacitive pressure sensor. The second bond pad is supported by the bond pad portion of the substrate. The method includes applying a reference potential to an electrically conductive barrier. The electrically conductive barrier is supported by the intermediate portion of the substrate. At least a portion of the electrically conductive barrier projects from the intermediate portion of the substrate. The applying the reference potential includes applying the reference potential to the portion of the electrically conductive barrier that projects from the intermediate portion of the substrate. The applying the input electric signal can include applying the input electric signal via a first wire. The first wire can be wire-bonded to the first bond pad. The receiving can include receiving the output electric signal from a second wire. The second wire can be wire-bonded to the second bond pad.

What is claimed is:

1. An integrated circuit, comprising:
    a semiconductor substrate;
    a semiconductor device supported by a device portion of the substrate;
    a plurality of bond pads supported by a bond pad portion of the substrate, wherein the plurality of bond pads is in electrical communication with the semiconductor device, and further wherein the bond pad portion is spaced apart from the device portion such that an intermediate portion of the substrate separates the device portion from the bond pad portion; and
    an electrically conductive barrier that is supported by the intermediate portion of the substrate, projects away from the intermediate portion of the substrate, and is configured to decrease capacitive coupling between the device portion and the bond pad portion.

2. The integrated circuit of claim 1, wherein the electrically conductive barrier comprises an electrically conductive barrier strip that is supported by the intermediate portion of the substrate.

3. The integrated circuit of claim 2, wherein the electrically conductive barrier further comprises an electrically conductive barrier wire that projects away from the electrically conductive barrier strip.

4. The integrated circuit of claim 1, wherein the integrated circuit further comprises a plurality of wires, wherein each of the plurality of wires is electrically connected to a selected one of the plurality of bond pads, and further wherein the electrically conductive barrier is configured to decrease a capacitive coupling between the semiconductor device and the plurality of wires.

5. The integrated circuit of claim 1, wherein the integrated circuit further comprises a plurality of electrically conductive regions that is supported by the semiconductor substrate, wherein the plurality of electrically conductive regions is configured to convey at least one electric current between the semiconductor device and the plurality of bond pads, and further wherein at least one of the plurality of electrically conductive regions is electrically isolated from the electrically conductive barrier.

6. The integrated circuit of claim 1, wherein the semiconductor substrate has a surface, wherein the intermediate portion has a length, which is measured along the surface, and a width, which is measured along the surface, wherein the length is greater than the width, and further wherein the electrically conductive barrier extends along an entirety of the length of the intermediate portion of the substrate.

7. The integrated circuit of claim 1, wherein the integrated circuit further comprises a reference potential generator that is electrically connected to the electrically conductive barrier and is configured to maintain the electrically conductive barrier at a reference potential.

8. The integrated circuit of claim 1, wherein a minimum distance between the device portion of the substrate and the bond pad portion of the substrate, as measured across the intermediate portion of the substrate, is less than 1 millimeter.

9. The integrated circuit of claim 1, wherein the semiconductor device comprises a capacitive sensor.

10. The integrated circuit of claim 1, wherein the semiconductor device comprises a capacitive pressure sensor configured to detect a pressure.

11. The integrated circuit of claim 10, wherein the capacitive pressure sensor comprises a reference region, which is configured to generate a reference signal, and a sense region, which is configured to generate a sense signal that is indicative of the pressure.

12. The integrated circuit of claim 1, wherein the integrated circuit further comprises a dielectric coating that at least partially encapsulates at least the device portion, the bond pad portion, the intermediate portion, and the electrically conductive barrier.

13. The integrated circuit of claim 12, wherein the dielectric coating comprises a dielectric gel, wherein the dielectric gel is configured to permit a pressure within an ambient environment that is proximal to the integrated circuit to apply a pressure force to the semiconductor device.

14. A method of manufacturing an integrated circuit, the method comprising:
    forming a semiconductor device such that the semiconductor device is supported by a device portion of a semiconductor substrate;
    forming a plurality of bond pads such that the plurality of bond pads is supported by a bond pad portion of the substrate, wherein the bond pad portion is spaced apart from the device portion such that an intermediate portion of the substrate separates the device portion from the bond pad portion;
    forming a plurality of electrically conductive regions such that the plurality of electrically conductive regions is supported by the semiconductor substrate and is configured to convey at least one electric current between the semiconductor device and the plurality of bond pads; and
    forming an electrically conductive barrier on the semiconductor substrate such that the electrically conductive barrier is supported by the intermediate portion of the substrate and projects from the intermediate portion of the substrate, wherein the electrically conductive barrier is configured to decrease capacitive coupling between the device portion of the substrate and the bond pad portion of the substrate.

15. The method of claim 14, wherein the forming the electrically conductive barrier comprises forming an electrically conductive barrier strip, which is supported by the intermediate portion of the substrate, and wire bonding an electrically conductive barrier wire to the electrically conductive barrier strip such that the electrically conductive barrier wire projects away from the electrically conductive barrier strip.

16. The method of claim 14, wherein the method further comprises at least partially encapsulating at least the device portion, the bond pad portion, the intermediate portion, and the electrically conductive barrier with a dielectric gel that is configured to permit a pressure within an ambient environment that is proximal to the integrated circuit to apply a pressure force to the semiconductor device.

17. The method of claim 14, wherein the forming the semiconductor device comprises forming a capacitive pressure sensor.

18. The method of claim 14, wherein the method further comprises wire bonding a respective wire to each of the plurality of bond pads.

19. A method of operating an integrated circuit, the method comprising:

applying an input electric signal to a first bond pad of the integrated circuit, wherein the first bond pad is electrically connected to a capacitive pressure sensor of the integrated circuit, wherein the capacitive pressure sensor is supported by a device portion of a semiconductor substrate of the integrated circuit, wherein the first bond pad is supported by a bond pad portion of the substrate, and further wherein the device portion is spaced apart from the bond pad portion such that an intermediate portion of the substrate separates the device portion from the bond pad portion;

receiving an output electric signal from a second bond pad of the integrated circuit, wherein the second bond pad is electrically connected to the capacitive pressure sensor and is supported by the bond pad portion of the substrate; and applying a reference potential to an electrically conductive barrier that is supported by the intermediate portion of the substrate, wherein at least a portion of the electrically conductive barrier projects from the intermediate portion of the substrate, and further wherein the applying the reference potential comprises applying the reference potential to the portion of the electrically conductive barrier that projects from the intermediate portion of the substrate.

20. The method of claim 19, wherein the applying the input electric signal comprises applying the input electric signal via a first wire that is wire-bonded to the first bond pad, and further wherein the receiving comprises receiving the output electric signal from a second wire that is wire-bonded to the second bond pad.

21. The method of claim 19 wherein during the applying the reference potential, the electrically conductive barrier decreases capacitive coupling between the device portion and the bond pad portion.

* * * * *